United States Patent [19]

Enomoto et al.

[11] Patent Number: 5,260,263
[45] Date of Patent: Nov. 9, 1993

[54] SUPERCONDUCTIVE CERAMIC WIRE AND METHOD FOR PRODUCING THE SAME

[75] Inventors: Ryo Enomoto; Yoshimi Matsuno; Masanori Tamaki, all of Ogaki, Japan

[73] Assignee: Ibiden Co., Ltd., Ogaki, Japan

[21] Appl. No.: 363,882

[22] PCT Filed: Oct. 19, 1988

[86] PCT No.: PCT/JP88/01057

§ 371 Date: Jun. 8, 1989

§ 102(e) Date: Jun. 8, 1989

[87] PCT Pub. No.: WO89/04048

PCT Pub. Date: May 5, 1989

[30] Foreign Application Priority Data

Oct. 19, 1987 [JP] Japan .................. 62-261662

[51] Int. Cl.$^5$ .................. C01F 11/02; C01F 17/00; C01G 3/02; H01L 39/24
[52] U.S. Cl. .................. 505/1; 419/4; 505/704; 505/725; 505/734; 505/740
[58] Field of Search .................. 505/725, 734, 735, 737, 505/738, 740, 741, 704, 1; 419/4, 24, 65

[56] References Cited

U.S. PATENT DOCUMENTS

| | | | |
|---|---|---|---|
| 3,406,025 | 10/1968 | Hamling | 419/4 |
| 3,943,994 | 3/1976 | Cleveland | 264/63 |
| 3,947,534 | 3/1976 | Mansmann | 264/63 |
| 4,342,712 | 8/1982 | Yajima et al. | 264/63 |
| 4,484,182 | 11/1984 | Enomoto et al. | 264/63 |
| 4,537,735 | 8/1985 | Enomoto et al. | 264/63 |
| 4,710,227 | 12/1987 | Harley et al. | 264/63 |
| 4,746,468 | 5/1988 | Ozaki et al. | 264/63 |

FOREIGN PATENT DOCUMENTS 308812 12/1988 Japan .................. 505/704

OTHER PUBLICATIONS

Uchikawa "Fabrication of $YBa_2Cu_3O_{7-x}$ Fibers ..." *Extend Abstracts: High Tc Super* MRS Symposium Apr. 5–9, 1988, pp. 89–92.
Pope "Organometallic polymer route to superconducting ... " Ext. Abstracts: High Temp. Super MRS Symp. Apr. 5–9, 1988 pp. 97–100.
Goto "Preparation of High-Tc Y-Ba-Cu-O Superconducting filaments..." *Jap. Jnl. Appl. Physics* vol. 26 No. 9 Sep., 1987 pp. L1527–L1528.
Nonaka "Ba-Y-Cu-O thin films fabricated by dip coating ... " *Jap. Jnl. Appl. Phys.* vol. 27 (5) May 1988 pp. L867–L869.
Zheng "Superconducting $YBa_2Cu_3O_{7-x}$ fibers ... " *Ext. Abst.: High Tc Supercond.* MRS Symp. Apr. 5–9, 1988 pp. 93–96.
Kramer "High Tc Superconducting films and powders ... " *Ext. Abst.: High-Tc Supercond.* MRS Symp. Apr. 5–9, 1988, pp. 67–68.
Poeppel et al. "Fabrication of $YBa_2Cu_3O_7$ Superconducting Ceramics" *ACS Symp. Chem. of High Tc Super.* Aug.–Sep. 1987 pp. 262–265.
Trolier "Dissolution of $YBa_2Cu_3O_{7-x}$ in Various Solvents" *Amer. Ceram. Soc. Bull.* 67(4) Apr. 1988 pp. 759–762.
Kohno "High Critical Current Density of Y-Ba-Cu-Oxide ... " *Jap. Jnl. Appl. Phys.* vol. 27(1) Jan. 1988 pp. L71–79.
Jin "Large magnetic hysteresis in melt-textured ... " *Appl. Phys. Lett.* vol. 54(6) Feb. 6, 1989 pp. 584–586.
Salama "High current density in bulk $YBa_2Cu_3O_x$ superconductor" *Appl. Phys. Lett.* vol. 54(23) Jun. 5, 1989 pp. 2352–2354.
Ikeno "Characterization and Superconducting properties ... " *MRS: Internat. Symp. Proceeding* vol. 6 1989 pp. 169–173.

*Primary Examiner*—Paul Lieberman
*Assistant Examiner*—John Boyd
*Attorney, Agent, or Firm*—Sherman and Shalloway

[57] ABSTRACT

A superconductive ceramic wire material composed of rare earth elements, alkali earth metals, copper, and oxygen, which is obtained by mixing a powder containing oxides of the component elements of the superconductive ceramic with a solution containing organic compounds of the component elements, forming the mixture into a wire, and firing the wire in a temperature range from 850° to 949° C. in an oxygen-containing atmosphere.

12 Claims, 1 Drawing Sheet

SUPERCONDUCTIVE CERAMIC WIRE AND METHOD FOR PRODUCING THE SAME

FIELD OF THE INVENTION

This invention relates to a superconductive ceramic wire comprising superconductive fine crystals and a method for producing the same, more specifically to a superconductive ceramic wire which comprises fine, densely sintered crystals and having a high critical temperature and a high critical current density, and a method for producing the same.

BACKGROUND OF THE INVENTION

Recently, there have been found superconductive ceramics that can be used at liquid nitrogen temperature, exerting great industrial impact.

However, to use these superconductive ceramics in practical applications, it is essential to form these materials into wires, and it has been an important technical task how to form such hard, brittle ceramics into wires.

On the production of a wire material comprising a superconductive ceramic, the BULLETIN OF CERAMIC SOCIETY OF JAPAN, volume 22 (1987) No. 6, on page 526, describes a production method for a wire material, in which a ceramic powder is charged into a silver pipe which, after being drawn into a wire and wound into a coil, is heat-treated in an oxygen atmosphere. In addition, the Algonne National Institute has proposed a production method for a wire material comprising a superconductive ceramic, in which a Y-Ba-Cu-O powder is mixed with a polymer and formed into a wire, which is burnt to yield a flexible wire.

However, the former method, in which the ceramic powder is heat-treated in the interior of the metal pipe, is difficult to yield a dense sinter and achieve a sufficient superconductive contact between particles. Moreover, the method is defective in that the metal tends to diffuse into the superconductive ceramic during the heat treatment and it is difficult to precisely control the oxygen content which has substantial effects on characteristics of the resulting superconductive wire. The latter method is defective, among others, in that it is difficult to maintain the shape of the material during the combustion of the polymer until sintering begins, and that dense sintering causes growth of grains resulting in deteriorated mechanical characteristics and even causes decomposition which results in considerably lowered superconductive characteristics. Further, in Japanese Journal of Applied Physics, vol. 26 (1987) Supplement 26-3, on page 1211, is disclosed a production method for a wire in which a solution containing nitrates of Y, Ba, and Cu is mixed with powders of $Y_2O_3$, $BaCO_3$, and CuO, and the mixture is formed into a wire and then fired. However, this method is also defective, among others, in that dense sintering causes growth of grains, resulting in deteriorated mechanical characteristics.

As described above, in the prior art procedures, there have been known no production methods for wires consisting of densely sintered fine crystal grains of superconductive ceramics which have a high critical temperature and a high critical current density.

With a view to obviate the prior art defects of superconductive ceramic wire materials, it is a primary object of the present invention to provide a superconductive ceramic wire material which comprises densely sintered fine crystals and has a high critical temperature and a high critical current density, and a method for producing the same.

SUMMARY OF THE INVENTION

In an effort to solve the above-described problems, the inventor of the present invention has conducted research. Based on findings obtained through the research and in accordance with the present invention which attains the above object, there is provided a superconductive ceramic wire material comprising superconductive oxide fine crystals less than 5 $\mu$m in average grain size produced using procedures in which an oxide fine powder comprising rare earth elements, alkali earth metals, copper, and oxygen is uniformly mixed with a solution containing organic compounds of the above elements, the mixture is formed into a wire which is then fired in a temperature range from 850° to 940° C. in an oxygen-containing atmosphere.

There is also provided according to the present invention a method for producing a superconductive ceramic wire material in which an oxide fine powder comprising rare earth elements, alkali earth metals, copper, and oxygen is uniformly mixed with a solution containing organic compounds of the above elements, the mixture is formed into a wire which is then fired in a temperature range from 850° to 940° C. in an oxygen-containing atmosphere.

DESCRIPTION OF PREFERRED EMBODIMENTS

Figure 1:
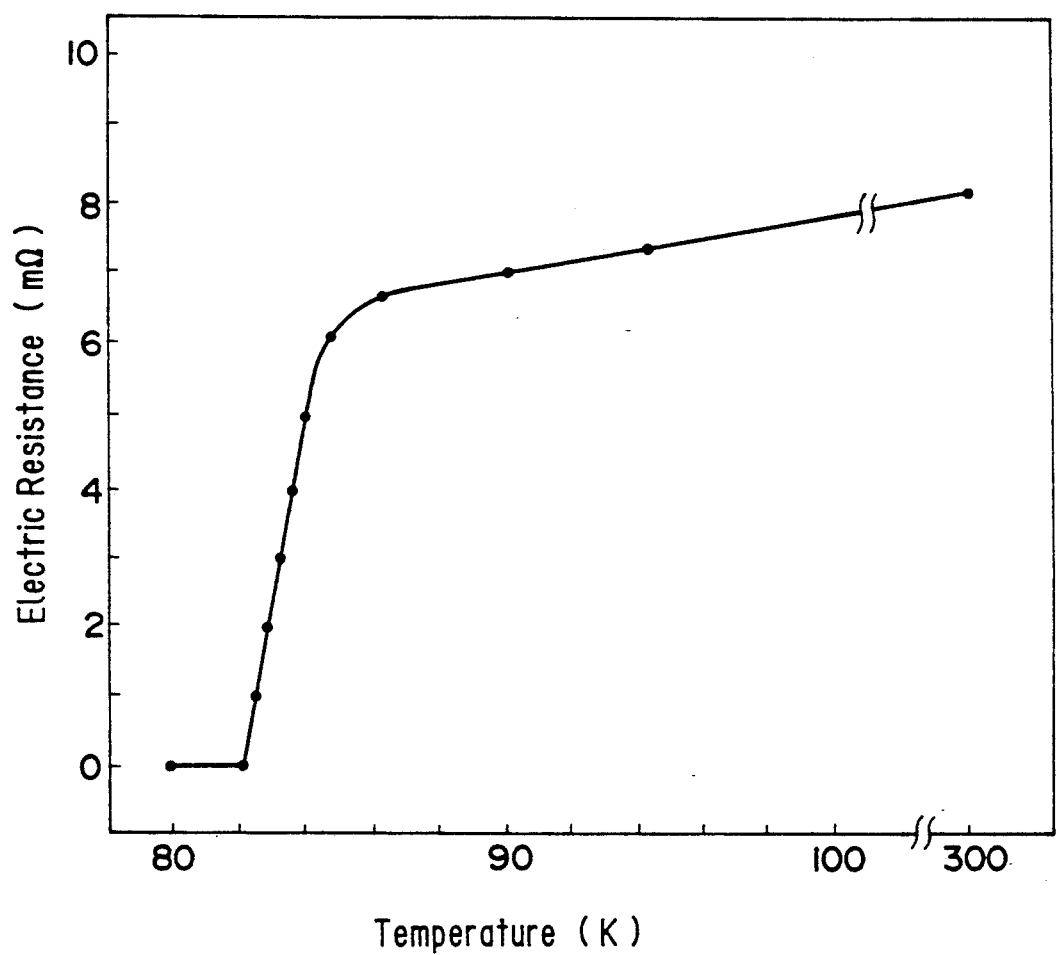
FIG. 1 is a graph showing dependence of electrical resistance on temperature.

Superconductive oxide fine crystals used in the present invention are composed of rare earth elements, alkali earth elements, copper, and oxygen. The rare earth elements can be at least one element selected from the group consisting of Y, Nd, Sm, Eu, Gd, Ho, Er, Tm, Yb, Lu, and La, and the alkali earth elements can be at least one element selected from the group consisting of Ba, Ca, and Sr. Actual chemical compositions of the crystals include, for example, $YBa_2Cu_3O_{6.5+x}$, $TmBa_2Cu_3O_{6.5+x}$, $(La_{1-x}Ba_x)_2CuO_{4-y}$, $(La_{1-x}Sr_x)_2CuO_{4-y}$, and, in particular, superconductive oxide fine crystals represented by a general formula of $RA_2Cu_3O_{6.5+x}$ (where R: rare earth element, A: alkali earth element) are preferable because they exhibit high superconductive critical temperature of around 90K.

The superconductive ceramic wire material according to the present invention is obtained by a process in which an oxide fine powder comprising rare earth elements, alkali earth metals, copper, and oxygen is uniformly mixed with a solution containing organic compounds of the above elements, the mixture is formed into a wire which is then fired in a temperature range from 850° to 940° C. in an oxygen-containing atmosphere. The organic compounds are preferably formulated so that they are converted by firing into superconductive oxides. The reason why the organic compounds are used in the present invention is that the oxide powders, as sintering proceeds, undergo growth of crystal grains resulting in coarse crystals, and impurities contained in the mixture deposit on the crystal grain boundaries to form an insulative layer, which deteriorates mechanical and superconductive characteristics of the resulting superconductive wire material, whereas the organic compounds become superconductive oxides at relatively low temperatures, allowing sintering of the oxide powders at low temperatures and suppressing crystal growth to result in a fine, dense sinter and, since the crystal grain boundaries comprise superconductive oxides produced from the organic compound solution, there exists no insulative layer, thus obtaining a superconductive ceramic wire material with improved superconductive and mechanical characteristics. Ratios of the organic compounds added to the oxide powders will be described in the production method which will be described later herein.

Average diameter of the superconductive oxide fine crystals must be less than 5 $\mu$m, preferably less than 2 $\mu$m. This is because average crystal diameters of greater than 5 $\mu$m result in brittle superconductive ceramics with considerably inferior mechanical characteristics.

It is preferable that the superconductive ceramic has a porosity ratio of below 10%, more preferably below 4%. This is because, if the porosity ratio is greater than 10%, linking areas between the superconductive oxide fine crystal grains are decreased, resulting in a reduced critical current density, which is not preferable.

As described above, the superconductive ceramic wire material according to the present invention has a high critical temperature and a high critical current density because it is finely and densely sintered with suppressed growth of superconductive oxide fine crystals by the function of the organic compounds. The wire material has diameters of 7 to 600 $\mu$m, and one which has a diameter of 7 to 20 $\mu$m has good flexibility and enhanced mechanical properties.

Next, a production method for the superconductive ceramic wire material will now be described. The oxide fine powder comprising rare earth elements, alkali earth metals, copper, and oxygen used in the production method according to the present invention can be produced by any of the following methods: 1) powders of oxides or carbonates of the rare earth elements, alkali earth metals, and copper are mixed in a predetermined ratio and fired, 2) aqueous solutions of nitrates or chlorides of the rare earth elements, alkali earth metals, and copper are mixed in a predetermined ratio, and the mixed solution is mixed with an aqueous solution of oxalic acid or the like and the pH value of the mixture is adjusted to obtain a precipitate, which is filtered and fired, 3) metal alkoxide solutions of the rare earth elements, alkali earth metals, and copper are mixed in a predetermined ratio, water is added to the mixed solution to cause hydrolysis and condensation polymerization, and the resulting gel-like substance is subjected to thermal decomposition or firing, and 4) organic compounds of the above elements are thermally decomposed or fired. Of these methods, the coprecipitation method in 2) and the sol-gel method in 3) are particularly advantageous because these methods can provide a uniform ultra-fine powder. The mixing ratio is preferably set to a theoretical compositional ratio for the superconductive oxide crystals.

The oxide fine powder is preferably to be one which is produced using thermal decomposition or firing at a temperature of over 400° C. This is because, if the thermal decomposition or firing temperature is lower than 400° C., insufficient thermal decomposition of the organic compounds results, or it is difficult to diffuse the individual elements to obtain an oxide fine powder of uniform composition. Moreover, it is preferable that the oxide fine powder is a composition that exhibits superconductivity. The thus obtained oxide is pulverized in a jet mill, a ball mill or the like into an oxide fine powder, which may then be subjected to particle size adjustment using an air-flow classifier or the like.

The oxide fine powder preferably has an average particle diameter of less than 1 $\mu$m, more preferably less than 0.3 $\mu$m. This is because, if the average particle size is greater than 1 $\mu$m, it becomes difficult to form into a fine wire with a uniform diameter, and the resulting fired wire material has coarse crystal grains and low density, with inferior mechanical properties.

The present invention involves mixing of the oxide fine powder with the solution comprising the organic compounds. The organic compounds are contained in the homogeneous solution which can be very uniformly dispersed between the oxide particles and thus can act as an auxiliary for the formation of the material into a wire and as a binder to maintain the shape of the formed material during firing. Furthermore, since the organic compounds can bind the oxide fine powder at low temperatures, they act as an auxiliary to suppress growth of crystal grains and for fine and dense sintering of the superconductive oxide crystals. Since the crystal grain boundaries comprise a superconductive oxide formed from the organic compounds through firing, no impurity layer is present in the grain boundaries, and thus the superconductive ceramic wire material according to the present invention has extremely enhanced superconductive characteristics. The organic compounds are preferably of at least one type selected from the group consisting of alkoxides, hydrolyzed products of alkoxides, oleates, naphthenates, acetates, formates, gluconates, stearates, octanoates, and propionates of rare earth elements, alkali earth metals, and copper. Solvents used to dissolve the organic compounds include, for example, alcohols, toluene, benzene, hexane, isopropylamine, acetic acid, formic acid, propionic acid and other organic acids. Part of the organic compounds can be replaced by simple substances, nitrates, chlorides, or carbonates of the rare earth elements, alkali earth metals, or copper.

The present invention involves mixing of the oxide fine powder with the solution containing the organic compounds and forming the resulting mixture into a wire. In this case, various forming auxiliaries which will be described later can be added to facilitate formation into the wire. Or, the oxide fine powder and the solution comprising the organic compounds are mixed, dried, and made into a viscous liquid which can then be formed into a wire. The drying is to evenly coat the surface of the oxide fine powder with the organic compounds, for efficient manifestation of the functions of the organic compounds as described above. The drying can be heat drying, vacuum drying, natural drying or the like, and, for the above-described reasons, is advisably carried out under efficient stirring. The preparation of the viscous liquid after drying is to facilitate formation into the wire. In the preparation, a deflocculant, and/or an organic polymer binder to adjust viscosity and thixotropy, and/or a forming auxiliary such as a plasticizer to improve the flexibility of the wire before firing, and/or a solvent to dissolve these additives. The deflocculant includes, for example, trioleic acid glyceride (triolein), natural fish oil, synthetic surfactant, benzenesulfonic acid, menhaden oil, sardine oil, and methyl oleate. The binder includes, for example, polyethylene glycol, glycerin, polypropylene oxide, nitrocellulose, polyethylene, cellulose acetate-butyrate, polyacrylic esters, polymethyl methacrylate, polyvinyl alcohol, polyvinyl butyral, polyvinyl chloride, polymethacrylic esters, ethylcellulose, and abietic acid resins. The plasticizer includes, for example, dibutyl phthalate, butyl stearate, dimethyl phthalate, methyl adipate, butylbenzyl phthalate, phthalic esters, polyethylene glycol, and tricresyl phosphate. The solvent includes, for example, various alcohols, toluene, acetone, benzene, dichloroethane, dichloromethane, trichloroethylene, xylene, and hexane. In the present invention, at least one selected from the above substances can be added. The deflocculant, the binder, the plasticizer, and the solvent may be added at a time but, preferably, the deflocculant and the solvent are first added, followed by the binder and then the plasticizer, or by the plasticizer and then the binder. In the present invention, after mixing the above substances, the mixture can be concentrated to adjust the viscosity and thixotropy.

In the present invention, the oxide fine powder and the solution comprising the organic compounds are mixed and then formed into a wire. It is preferable to add the organic compounds in amounts within the range of 0.2 to 18 parts by weight, converted to solid oxides after firing, more preferably within the range of 0.5 to 12 parts by weight, to 100 parts by weight of the oxide fine powder. This is because, if the amount of addition is less than 0.2 parts by weight, considerable growth of crystal grains takes place and a fine, dense sinter cannot be obtained, and deposition of a grain boundary insulative layer occurs which causes decreases in wire strength and superconductive characteristics. On the other hand, if the amount of addition exceeds 18 parts by weight, sintering of superconductive oxide fine crystals is suppressed and a dense sinter is not obtained, resulting in decreased wire strength and superconductive characteristics. The wire formation method includes, for example, spinning of the mixture by extrusion under pressure, spinning by drawing, and various combinations of these procedures. The wire material can be processed into a variety of shapes such as coils, or alternatively, the mixture can be previously formed into the desired shape and then fired.

After the mixture is formed into a wire, it is fired at a temperature between 850° and 940° C., preferably between 850° and 920° C. The firing atmosphere must be a gas containing oxygen to adjust the oxygen content of the fired superconductive ceramic, and can be oxygen alone, or a mixture of oxygen with argon, helium, or nitrogen, or air, of which the oxygen concentration is preferably 50 to 100%. The reason why the firing temperature is set within the range of 850° to 940° C. is that, at temperatures below 850° C., the oxide fine powder is not sintered finely and densely, resulting in decreased wire strength and superconductive characteristics of the resulting wire material. On the other hand, firing temperatures exceeding 940° C. cause considerable growth of sintered crystal grains, resulting in a brittle wire. In the present invention, it is preferable to repeat at least once the procedure involving impregnation of the fired wire with the solution comprising the organic compounds, followed by firing, to enhance the density of the resulting wire material. It is preferable to cool down the material, which has been fired at a temperature of 850° to 940° C., at a cooling rate of less than 60° C./hour in an oxygen-containing gas atmosphere in order to obtain enhanced superconductive characteristics, and the cooled material may be again fired in an oxygen-containing gas atmosphere. The resulting superconductive ceramic wire material according to the present invention, to stabilize its superconductive characteristics and enhance the mechanical properties, for example, can be contained in a metal pipe such as made of copper, coated on its surface with a metal by vacuum deposition or ion plating, or coated with a gas-impermeable plastic.

EMBODIMENTS

Preferred embodiments of the present invention will now be described.

EMBODIMENT 1

1) 100 parts by weight of a commercial yttrium oxide (purity: 99.9%, by Mitsuwa Kagaku), 332 parts by weight of barium carbonate powder (purity: 99.9%, by Raretalic), and 201 parts by weight of copper (II) oxide powder (purity: 99.9%, by Raretalic) were respectively weighed and, after being thoroughly mixed, formed into a pellet, which was fired in air at a temperature of 920° C. for 6 hours, pulverized and mixed, and again formed into a pellet.

2) The pellet obtained in step 1) was fired in air at a temperature of 920° C. for 8 hours, pulverized and mixed, and then formed into a pellet.

3) The pellet obtained in step 2) was fired in air at a temperature of 930° C. for 24 hours, and then pulverized to an average particle diameter of less than 0.2 $\mu$m to yield an oxide powder which is used in the present invention.

4) 2.4 parts by weight of yttrium butylate, 3.5 parts by weight of barium ethylate, and 5.6 parts by weight of copper ethoxyethylate were mixed with 40 parts by weight of ethyl alcohol and 50 parts by weight of toluene to prepare a homogeneous solution. The homogeneous solution was mixed with 100 parts by weight of the oxide powder obtained in step 3) and then concentrated to prepare a viscous liquid.

5) The liquid obtained in step 4) was extruded under pressure through a nozzle to prepare a wire-formed molding.

6) The wire-formed molding obtained in step 5) was fired in a 100% oxygen atmosphere in a tubular furnace at a temperature of 850° C. for 2 hours and then cooled down at a rate of 10° C./hour. Then the fired molding was impregnated with a homogeneous solution prepared in the same formulation as in step 4), fired again in a 100% oxygen atmosphere in the tubular furnace at a temperature of 850° C. for 2 hours, and cooled down at a rate of 10° C./hour to prepare the superconductive ceramic wire material according to the present invention which has a diameter of 50 to 300 $\mu$m, an average crystal diameter of 1 $\mu$m, and a porosity ratio of 5%.

The thus obtained superconductive ceramic wire material according to the present invention was cut to a given length to prepare a test specimen for superconductive characteristic measurement which, while controlling the specimen temperature by a cryostat, was measured for electrical resistance and current density under zero magnetic field. Plot of the measured electrical resistance against temperature is shown in FIG. 1. The critical temperature is determined from the figure and the result is shown in Table 1 together with the critical current density.

EMBODIMENT 2

1) 4.7 parts by weight of yttrium butylate, 7.0 parts by weight of barium ethylate, and 9.2 parts by weight of copper acetate were mixed with 50 parts by weight of ethyl alcohol and 50 parts by weight of toluene to prepared a homogeneous solution. The homogeneous solution was mixed with 100 parts by weight of an oxide fine powder prepared by the same method as in Embodiment 1 and vacuum dried using an evaporator under stirring.

2) The mixture obtained in step 1) was mixed with 1.3 parts by weight of triolein, 44.1 parts by weight of toluene, and 13.4 parts by weight of isopropyl alcohol and, after being thoroughly mixed, was then mixed with 4.7 parts by weight of polyvinyl butyral, 1.3 parts by weight of polyethylene glycol, and 0.7 parts by weight of dibutyl phthalate, followed by thorough mixing and concentrating, to prepare a viscous liquid.

3) The liquid obtained in step 2) was extruded under pressure through a nozzle to prepare a wire-formed molding. 4) The wire-formed molding obtained in step 3) was fired in a 100% oxygen atmosphere at a temperature of 870° C. for 2 hours and then cooled down at a rate of 15° C./hour to prepare the superconductive ceramic wire material according to the present invention, with a diameter of 50 to 300 μm, an average crystal diameter of 0.8 μm, and a porosity ratio of 3%, which was measured for the critical temperature and critical current density under zero magnetic field using the same methods as in Embodiment 1. The result is shown in Table 1.

EMBODIMENT 3

1) 1.2 parts by weight of yttrium butylate, 1.7 parts by weight of barium ethylate, and 7.2 parts by weight of copper oleate were mixed with 40 parts by weight of ethyl alcohol and 50 parts by weight of toluene to prepare a homogenous solution. The homogeneous solution was mixed with 100 parts by weight of a superconductive oxide fine powder which, having an average particle diameter of 0.2 μm, was produced by a wet coprecipitation method and adjusted to an yttrium:barium:copper ratio of 1:2:3. Using the same procedure as in Embodiment 2, the mixture was mixed with 1.3 parts by weight of triolein, 13.4 parts by weight of isopropyl alcohol, 44.1 parts by weight of toluene, 4.7 parts by weight of polyvinyl butyral, 1.3 parts by weight of polyethylene glycol, and 0.7 parts by weight of dibutyl phthalate to prepare a viscous liquid, which was then formed into a wire.

2) The wire-formed molding obtained in step 1) was fired in a 100% oxygen atmosphere at a temperature of 880° C. for 2 hours and then cooled down at a rate of 15° C./hour. Then, a procedure in which the fired molding was impregnated with a homogeneous solution prepared using the same formulation as in step 1) and fired in a 100% oxygen atmosphere at a temperature of 880° C. for 2 hours was repeated three times to prepare the superconductive ceramic wire material according to the present invention, with a diameter of 50 to 300 μm, an average crystal diameter of 1.5 μm, and a porosity ratio of 2%, which was measured for the critical temperature and critical current density under zero magnetic field using the same methods as in Embodiment 1. The result is shown in Table 1.

EMBODIMENT 4

1) 155 parts by weight of toluene was mixed with 75 parts by weight of propionic acid and then with 11 parts by weight of metallic barium to obtain a homogeneous solution.

2) The solution obtained in step 1) was mixed with 12 parts by weight of yttrium butylate to obtain a homogeneous solution.

3) 24 parts by weight of copper acetate hydrate was dissolved in 35 parts by weight of isopropylamine to obtain a homogeneous solution, which was then mixed with the solution obtained in step 2) to prepare a homogeneous solution.

4) The solution obtained in step 3) was mixed with 150 parts by weight of toluene and 60 parts by weight of propionic acid to prepare a homogeneous solution.

5) The solution obtained in step 4) was subjected to thermal decomposition at a temperature of 500° C. for 1 hour in a nitrogen gas atmosphere, and then for 30 minutes in an oxygen gas atmosphere, followed by pulverization in a ball mill to prepare a powder.

6) The powder obtained in step 5) was fired at a temperature of 500° C. in an oxygen atmosphere, and then passed through a 166-mesh screen to obtain an oxide powder which is used in the present invention.

7) 100 parts by weight of the solution obtained in step 4) was concentrated down to 20 parts by weight by a rotary evaporator at a temperature of 70° C. to obtain a homogeneous solution.

8) 100 parts by weight of the powder obtained in step 6) and 47 parts by weight of the solution obtained in step 7) were mixed in a mortar and concentrated at a temperature of 70° C. to prepare a viscous liquid.

9) The liquid obtained in step 8) was extruded through a nozzle at a temperature of 70° C. under pressure to prepare a wire-formed molding.

10) The wire-formed molding obtained in step 9) was vacuum-dried at room temperature, and then dried at 60° C. for 48 hours, at 90° C. for 24 hours, and at 110° C. for 24 hours, respectively.

11) The wire-formed molding obtained in step 10) was fired in a 100% oxygen atmosphere at a temperature of 900° C. for 24 hours and then cooled down at a rate of 1° C./hour to prepare the superconductive ceramic wire material according to the present invention, with a diameter of 50 to 300 μm, an average crystal diameter of 2 μm, and a porosity ratio of 3%, which was measured for the critical temperature and critical current density under zero magnetic field using the same methods as in Embodiment 1. The result is shown in Table 1.

EMBODIMENT 5

1) Using 100 parts by weight of an oxide fine powder of 0.2 μm in average particle diameter, prepared by a wet coprecipitation method and adjusted to an yttrium:barium:copper ratio of 1:2:3, and 46.8 parts by weight of the solution obtained in step 7) of Embodiment 4, the superconductive ceramic wire material according to the present invention with a diameter of 50 to 300 μm, an average crystal diameter of 2 μm, and a porosity ratio of 4% was prepared, which was measured for the critical temperature and critical current density under zero magnetic field using the same methods as in Embodiment 1. The result is shown in Table 1.

TABLE 1

| | Embodiment | | | | |
|---|---|---|---|---|---|
| | 1 | 2 | 3 | 4 | 5 |
| Critical temperature (K) | 82 | 85 | 88 | 91 | 91 |
| Critical current density (A/cm$^2$) | 1400 | 1900 | 2300 | 3600 | 3800 |

Electron microscopic observation of cross sections of the superconductive ceramic wire material according to the present invention revealed that the material was sintered very densely.

POSSIBLE INDUSTRIAL APPLICATIONS

As can be seen from the above description and results of the embodiments, with the present invention, a wire material comprising a superconductive ceramic can be readily produced, with suppressed growth of superconductive oxide crystals, which is sintered extremely finely and densely. With a high critical current density and a high critical temperature, the superconductive ceramic wire material according to the present invention is highly adaptable for use in a variety of industrial applications such as electronics, energy-related, and medical fields.

We claim:

1. A method for producing a superconductive ceramic wire material comprising mixing an oxide fine powder superconductive composition (A') comprising rare earth elements, alkali earth metals, copper, and oxygen with an organic solvent solution containing organic compounds (B') of rare earth elements, alkali earth metals and copper, said organic compounds producing a superconductive oxide composition when sintered to obtain a uniform mixture, forming said mixture into a wire, and firing and sintering said wire at a temperature in the range of from 850° to 940° C. in an oxygen-containing atmosphere to thereby convert said oxide fine powder superconductive composition (A') into densely sintered crystals (A) of less than 5 μm average grain diameter and to convert said organic compounds (B') in said solution to a superconductive oxide (B) present at the crystal grain boundaries of said superconductive oxide fine crystals (A).

2. A production method as claimed in claim 1, wherein said oxide fine powder superconductive composition (A) has an average particle diameter of less than 1 μm.

3. A production method as claimed in claim 1 or claim 2, wherein said superconductive oxide (B) is obtained by thermal decomposition of said organic compounds (B').

4. A production method as claimed in claim 1 or claim 2, wherein said organic compounds are of at least one type selected from the group consisting of alkoxides, hydrolyzed products of alkoxides, oleates, naphthenates, acetates, formates, gluconates, stearates, octanoates, and propionates of rare earth elements, alkali earth metals, and copper.

5. A production method as claimed in claim 1 or claim 2, wherein said solution containing said organic compounds is prepared by dissolving metallic barium in propionic acid and toluene, followed by adding a mixture of a toluene solution of a rare earth element alkoxide, copper acetate, and isopropylamine.

6. A production method as claimed claim 1 or claim 2, which further comprises the steps of impregnating said fired and sintered wire with said solution of said organic compounds (B') and firing and sintering said impregnated wire at a temperature in the range of from 850° to 940° C., said steps of impregnating and refiring being carried out at least once.

7. A production method as claimed in claim 1 or claim 2, wherein amount of each of said organic compounds (B') is in a range from 0.2 to 18 parts by weight, converted to solid oxide after being fired, to 100 parts by weight of said oxide fine powder (A).

8. The method of claim 1 wherein said oxide fine powder superconductive composition (A') has an average particle diameter of less than 0.3 μm and, wherein after firing said oxide fine powder superconductive composition is converted to superconductive oxide fine crystals (A) having an average grain diameter of less than 5 μm.

9. The method of claim 8 wherein after firing the superconductive oxide fine crystals (A) have an average grain diameter of less than 2 μm.

10. The method of claim 1, wherein said organic solvent is selected from the group consisting of alcohols, toluene, benzene, hexane, isopropylamine and organic acids.

11. A production method as claimed in any one of claims 1 or 2 wherein said organic compound of said individual elements are of at least one type selected from the group consisting of alkoxides, hydrolyzed products of alkoxides, oleates, naphthenates, acetates, formates, gluconates, stearates and octanoates of rare earth elements, alkali earth metals and copper.

12. The method of claim 1, wherein said organic solvent is selected from the group consisting of alcohols, toluene, benzene and hexane.

* * * * *